US010289760B1

(12) United States Patent
Oakes, III et al.

(10) Patent No.: US 10,289,760 B1
(45) Date of Patent: May 14, 2019

(54) ASSESSING POTENTIAL WATER DAMAGE

(71) Applicant: United Services Automobile Association (USAA), San Antonio, TX (US)

(72) Inventors: Charles L. Oakes, III, Boerne, TX (US); Bradly J. Billman, San Antonio, TX (US); Wayne M. Hartman, San Antonio, TX (US); Amanda Danko, Albany, NY (US)

(73) Assignee: United Services Automobile Association (USAA), San Antonio, TX (US)

( * ) Notice: Subject to any disclaimer, the term of this patent is extended or adjusted under 35 U.S.C. 154(b) by 865 days.

(21) Appl. No.: 13/901,001

(22) Filed: May 23, 2013

(51) Int. Cl.
*G06F 17/50* (2006.01)

(52) U.S. Cl.
CPC .............................. *G06F 17/5009* (2013.01)

(58) Field of Classification Search
None
See application file for complete search history.

(56) References Cited

U.S. PATENT DOCUMENTS

| 8,280,633 B1 * | 10/2012 | Eldering | G01W 1/10 |
| | | | 702/3 |
| 8,922,645 B1 * | 12/2014 | Ho | G06T 5/50 |
| | | | 348/135 |

| 2013/0144658 A1 * | 6/2013 | Schnabolk | G06Q 40/08 |
| | | | 705/4 |
| 2014/0368373 A1 * | 12/2014 | Crain | G01S 5/02 |
| | | | 342/5 |

OTHER PUBLICATIONS

Van der Poel, J. T., E. Gastine, and F. J. Kaalberg. "Monitoring for construction of the North/South metro line in Amsterdam, The Netherlands." Geotechnical Aspects of Underground Construction in Soft Ground (Bakker KJ, Bezuijen A, Broere W and Kwast EA (eds)). Taylor & Francis, London (2006): 745-750.*
Goodrich, D. C., et al. "The AGWAKINEROS2 suite of modeling tools." Proc. 2010 Watershed Management Conf. 2010.*
Nadal, Norberto C., et al. "Building damage due to riverine and coastal floods." Journal of Water Resources Planning and Management 136.3 (2009): 327-336.*

\* cited by examiner

*Primary Examiner* — Bijan Mapar
(74) *Attorney, Agent, or Firm* — Fish & Richardson P.C.

(57) ABSTRACT

The present disclosure provides systems, methods, and machine-readable media for assessing potential water damage. One or more embodiments include surveying a structure with a sensor in communication with a mobile computing device, generating a model of the structure based on the survey of the structure, simulating water movement in relation to the structure to determine a potential for water damage to the structure, and determining whether to purchase flood insurance for the structure based on the simulation of the water movement in relation to the structure.

13 Claims, 3 Drawing Sheets

ASSESSING POTENTIAL WATER DAMAGE

BACKGROUND

Insurance can be acquired for a structure to protect against incidents that can cause damage to the structure. In an example, the insurance policy can guard against losses occurring to the structure and/or to contents within the structure. Claims resulting from floods can be excluded from a standard insurance policy. However, flood insurance can be purchased, protecting an owner of the structure against losses caused by a flood.

In an example, even though an owner of a structure possesses flood insurance, some types of water damage to the structure may still not be covered by flood insurance. For example, water damage caused by wind driven rain may not be covered by flood insurance. Alternatively, and/or in addition, water damage can be caused by landscaping that is performed around the structure, which can affect water run-off and cause water damage to the structure.

DETAILED DESCRIPTION

Figure 1:
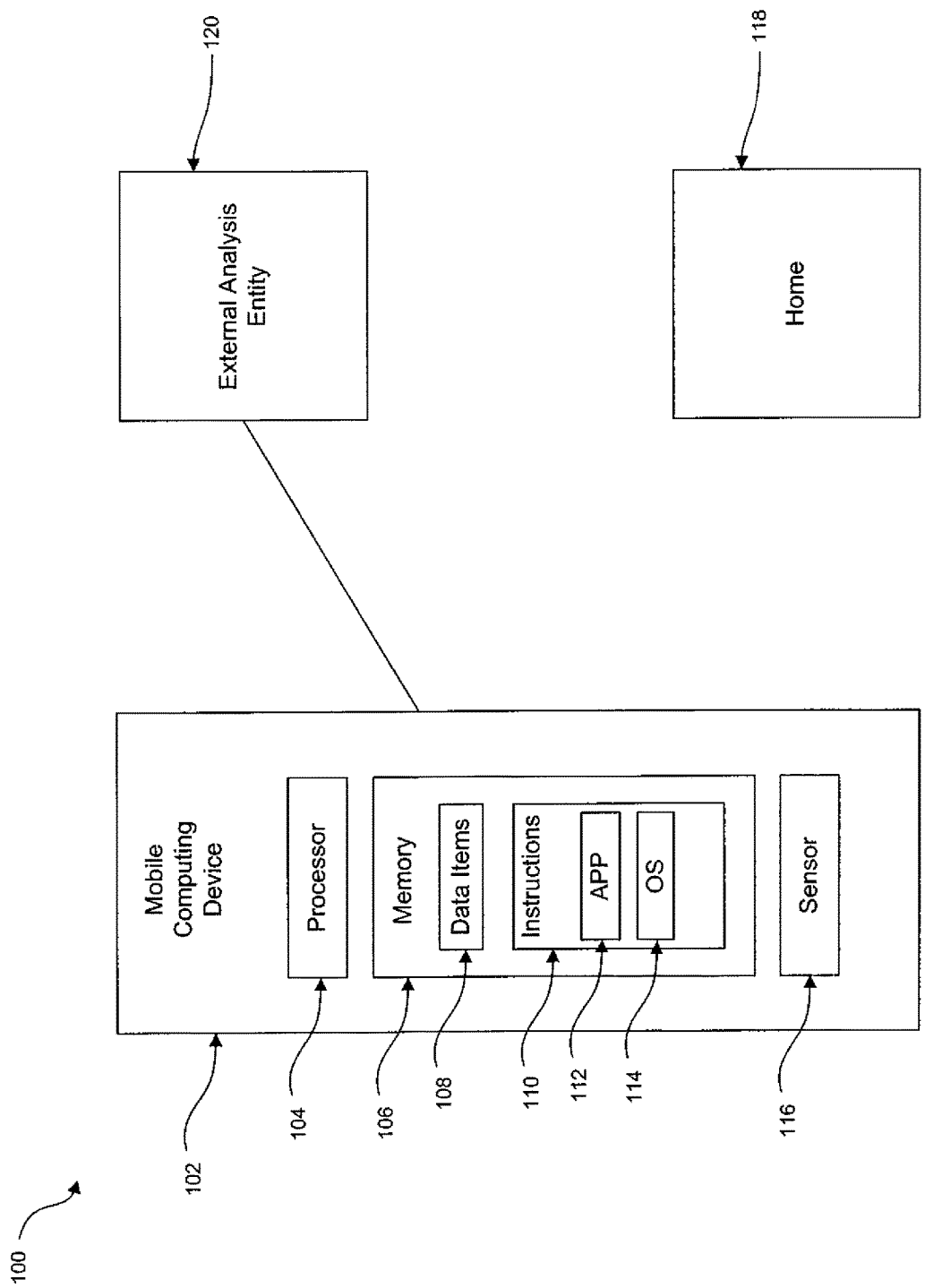
FIG. 1 illustrates an example of a system for assessing potential water damage according to one or more embodiments of the present disclosure.

The present disclosure provides systems, methods, and machine-readable media for assessing potential water damage. One or more embodiments include surveying a structure with a sensor in communication with a mobile computing device, generating a model of the structure based on the survey of the structure, simulating water movement in relation to the structure to determine a potential for water damage to the structure, and determining whether to purchase flood insurance for the structure based on the simulation of the water movement in relation to the structure.

Water can cause damage to structures, which can cause costly repairs and/or make the structure uninhabitable due to mold, for example. In an example, a structure can include a home, building associated with a business, and/or other type inhabitable structure. When structures are in flood plains, an owner of the structure may be likely to purchase flood insurance because a known risk for a flood exists. When a structure is not in a flood plain, an owner of the structure may not see a reason to purchase flood insurance because they do not believe a risk for flooding exists.

However, a structure may still suffer water damage, even when the structure is not in a flood plain. In an example, rain may cause an accumulation of standing water, which can cause damage to a property, but may not be present in a large enough quantity to be classified as a flood. Alternatively, and/or in addition, the accumulation of standing water can be caused as a result of landscaping that does not provide proper drainage of water. For instance, landscaping can be performed around a structure, which can cause water to drain toward the structure and accumulate next to the structure, rather than drain away from the structure. As such, a depth of the water may increase to a point where the water can enter the structure and cause damage. In an example, landscaping can include construction of physical elements (e.g., knee wall, patio) and/or adjustments made to land surrounding the structure, such as changing a slope and/or grading of land surrounding the structure.

Alternatively, and/or in addition, water damage can be caused to a structure as a result of wind driven rain. In an example, wind can cause rain to travel near horizontally and/or upward. For example, if wind causes rain to travel near horizontally, the rain can be driven vertically upon meeting an object or structure. In an example, when horizontally driven rain meets an exterior wall of a structure, the rain can be driven vertically. The rain can be driven vertically under an eave of the structure and can contact a soffit of the structure and/or vents placed within the soffit. As a result, the rain can enter the soffit vent and can cause damage to the structure.

In an example, water damage caused by improper landscaping and/or wind driven rain may not be covered under an insurance policy associated with the structure. A flood insurance policy may be needed to cover damage associated with the wind driven rain and/or improper landscaping. However, a flood insurance policy can be expensive and a person that does not live in a flood plain may see no reason to purchase such a policy.

Some embodiments of the present disclosure can assess a potential for water damage and provide a recommendation on whether to purchase flood insurance and/or provide a recommendation for limiting water damage based on the determined potential for water damage. In an example, some embodiments can generate a model of a structure, an associated piece of real estate, an adjacent structure, and/or an adjacent piece of real estate and simulate water movement in relation to the model to determine a potential for water damage. The model can be generated by a mobile computing device, in an example. For instance, the owner of the structure can download an application to the mobile computing device that can generate the model.

Some embodiments of the present disclosure can include generating a 3-dimensional model that can be used by a user of the mobile computing device to model potential water damage that can be caused. For instance, the user can rotate the model in multiple directions and/or zoom in on a portion of the model to determine whether portions of the structure are susceptible to water entering the structure and causing water damage. In an example, the simulated rain and/or water can be rotated in unison with the 3-dimensional model.

Some embodiments of the present disclosure can include providing the recommendation on whether to purchase flood insurance based on the determined potential for water damage. For instance, a quote for flood insurance can be provided to the owner of the structure via the application that has been downloaded to the mobile computing device of the owner of the structure.

Some embodiments of the present disclosure can include providing the recommendation for limiting water damage based on the determined potential for water damage. For instance, a recommendation for limiting water damage based on the determined potential for water damage can be provided to the owner of the structure via the application that has been downloaded to the computing device of the owner of the structure. In an example upon completion of the recommendation, the simulation of water movement in relation to the structure can be run again to determine whether the recommendation has provided an improvement. In an example, the recommendation can be completed physically and/or virtually.

In the following detailed description of the present disclosure, reference is made to the accompanying drawings that form a part hereof, and in which is shown by way of illustration how one or more embodiments of the disclosure may be practiced.

These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

As used herein, "a" or "a number of" something can refer to one or more such things. For example, "a number of differences" can refer to one or more differences.

FIG. 1 illustrates an example of a system for assessing potential water damage according to one or more embodiments of the present disclosure. In the embodiment illustrated in FIG. 1, the system 100 is provided for assessing potential water damage. The system 100 can include a mobile computing device 102. The mobile computing device 102 can be, for example, a personal and/or business computer (e.g., laptop, tablet), for example. Alternatively, and/or in addition, mobile computing device 102 can be a mobile phone, personal digital assistant (PDA), or other handheld computing device, etc. In some embodiments, the mobile computing device 102 may not be a mobile computing device. For example, in some embodiments, the system can include a desktop computing device in place of and/or in addition to the mobile device 102.

Mobile computing device 102 can, for example, include a processor 104 and a memory 106. Mobile computing device 102 can include a display, a receiver and/or a transceiver (e.g., wired and/or wireless), among other components.

Memory 106 can include data items 108 and machine-executable instructions 110. Machine-executable instructions 110 can include a number of programs such as applications 112 (e.g., software objects and/or modules, among others) and an operating system 114.

Generally, programs can include routines, objects, components, data structures, etc. that perform particular tasks or implement particular abstract data types. Distributed computing environments may be used where tasks are performed by remote processing machines that are linked through a communications network or other data transmission medium. In a distributed computing environment, programs and other data may be located in local and/or remote computer storage media including memory storage devices.

The processor 104 executes instructions and can, in some devices, be utilized to control the operation of the entire device. The processor 104 can include a control unit that organizes data and program storage in memory and transfers data and/or other information between the various parts of the mobile computing device 102. Although the mobile computing device 102 is shown to contain only a single processor 104, the disclosed embodiment also applies to devices that may have multiple processors with some or all performing different functions and/or in different ways.

The memory 106 includes data items 108 and instructions 110 capable of being executed by the processor 104 to carry out the functions as described herein. In some embodiments, some or all of the functions are carried out via hardware in lieu of a processor-based system.

Further, although memory 106 is illustrated as being located in mobile computing device 102, embodiments of the present disclosure are not so limited. For example, memory 106 can also be located internal to another computing resource, e.g., enabling the machine-readable instructions to be downloaded over the Internet or another wired or wireless connection.

In some embodiments, mobile computing device 102 can have a display, which is that part of the mobile computing device 102, or connected thereto, to display information to a user of mobile computing device 102. The display may be for example, a liquid crystal display (LCD), however, any appropriate display device may be used. Further, mobile computing device 102 can include any number of displays.

In some embodiments, mobile computing device 102 can have a wireless transceiver that can be configured to send and/or receive wireless communication over any suitable communications network through any suitable communications protocol. In some such embodiments of the present disclosure, the wireless transceiver can send and receive long range RF signals, such as mobile phone signals, for example. In other embodiments, the RF transceiver can include a Bluetooth transceiver, a 802.XX transmitter such as a Worldwide Interoperability for Microwave Access (Wi-MAX) transceiver or a WiFi transceiver, or an active or passive radio-frequency identification (RFID) tag. Other suitable transceivers may include, but are not limited to, any transceiver that has wireless capabilities.

In some embodiments, a survey of a structure 118 and an associated piece of real estate can be completed with a sensor 116 in communication with the mobile computing device 102. In an example, the survey of the structure 118 can include a survey of an exterior of the structure 118 and/or an interior of the structure 118. In an example, the sensor 116 can be a camera, which can capture an image of the exterior of the structure 118 and/or a blueprint associated with the interior and/or exterior of the structure 118 with the sensor 116.

In an example, the sensor 116 can be a camera. For instance, the camera can be used to take an image of the exterior of the structure 118 and/or the blueprint associated with the interior and/or exterior of the structure 118 with the camera. Alternatively, and/or in addition, the camera can be used to take an image of a piece of real estate associated with the structure 118. For example, the camera can be used to take a picture of the lot that the structure 118 is built on and any associated landscaping features, such as a patio feature, a retaining wall, a tree, a bush, a slope, a hill, a depression, etc.

In an example, the camera can be a 2-D camera and/or a 3-D camera. Alternatively, and/or in addition, the camera can possess functionality for recording an infrared spectrum and/or electromagnetic spectrum. In an example, an image captured by the camera that includes the infrared spectrum can be used to find points where heat is escaping the structure. In an example, if heat escapes from the structure at particular points, this may be an indication that water can enter through those same points. For instance, if heat escapes from a crack in a wall, water may enter through the crack. As such, a determination for points associated with a potential for water entry can be determined based on an image captured by the camera that includes the infrared spectrum.

Alternatively, and/or in addition, the sensor 116 can be a global positioning system. In an example, the global positioning sensor can be used to survey the associated piece of real estate. For instance, an elevation of the associated piece of real estate can be determined by the mobile computing device 102 through data gathered via the global positioning system. In an example, a user can walk around the piece of real estate with the mobile computing device 102 and collect elevation data through the global positioning system.

In some embodiments, a 3-dimensional model of the structure 118 and/or the associated piece of real estate can be generated based on the survey of the structure 118 and/or the associated piece of real estate. In an example, generation of the 3-dimensional model of the exterior of the structure 118 may require multiple pictures of the exterior of the structure 118. For instance, instructions can be executed to direct the user of the mobile computing device 102 to take a picture of the structure 118 from multiple angles.

In some embodiments, a 3-dimensional model of the interior of the structure 118 can be generated based on the survey of the structure 118. In an example, the 3-dimensional model of the interior of the structure 118 can be generated based on the image of the blueprint of the structure 118. For instance, features of the interior of the structure 118 can be extracted from the blueprint of the interior of the structure 118. In an example, a width of a wall, position of a wall, position of stairs, position of wiring, etc. can be determined from the blueprint of the structure 118 and used to generate the 3-dimensional model of the interior of the structure 118.

In some embodiments, the 3-dimensional model can be rotated on the mobile computing device 102. In an example, the 3-dimensional model can be rotated on a user interface in communication with the mobile computing device 102. For instance, the user can rotate the 3-dimensional model by making a selection on the user interface through a pointing device or with their fingers, when the user interface is a touch screen. Enabling the 3-dimensional model to be rotated can allow a user to view different portions of the 3-dimensional model by turning the model until a desired portion of the model becomes visible. Alternatively, and/or in addition, a user can zoom in on a portion of the 3-dimensional model. For instance, a user can make a selection on the user interface through the pointing device or with their fingers, when the user interface is a touch screen.

In some embodiments, the model can include additional dimensions. In an example, the model can be a 4-dimensional model, which can include a fourth dimension of time. As such, the time dimension can be added to the 3-D model to determine changes that can occur in relation to the structure over time. For instance, a forecasted amount of weather (e.g., rain, wind, snow) can be modeled in relation to the structure to determine whether a potential for water damage exists. For instance, a particular rate of rainfall can be modeled. For instance, rainfall at a rate of 1 inch per hour can be modeled in relation to the structure. Alternatively, and/or in addition, a forecasted amount of weather can be modeled in relation to the structure to determine if erosion will occur to areas surrounding the structure.

Alternatively, and/or in addition, the time dimension can be added to the 3-D model to determine how materials used in construction of the structure deteriorate over time. For instance, siding materials, roofing materials, etc. can be modeled in relation to rain, wind, snow, and/or sun to determine wear patterns associated with the materials. In an example, a lifespan of the materials can be determined based on the wear patterns associated with the materials. In an example, the lifespan can be defined as a point at which the materials may no longer provide protection for the structure against water damage.

Alternatively, and/or in addition, the time dimension can be added to the 3-D model to determine how plant growth will affect water movement in relation to the structure. For instance, if vegetation (e.g., trees, bushes) is planted proximate to the structure, a height and/or coverage provided by the vegetation can be forecast for a defined number of years in the future. In an example, a canopy of a tree may affect a path of wind driven rain.

In some embodiments, rain and/or wind can be simulated in relation to the structure 118 and/or the associated piece of real estate to determine a potential for water damage to the structure 118. In an example, the rain can be represented in the simulation as lines, which can be representative of a path of an individual rain drop. For instance, as a speed of the wind increases, the lines can become more horizontal, representing that the path of the rain has become more horizontal, as a result of the wind. In an example, the lines can be of a different color than a background of the image taken by the camera. This can enable a user to more clearly see a path associated with the rain.

In an example, the amount of rain and/or the speed of the wind can be varied. As such, the amount of rain and/or the speed of the wind can be increased to determine at what point water damage may be caused to the structure 118. In an example, the user can make a selection via the user interface of the mobile computing device 102 to vary the amount of rain and/or the speed of the wind.

In some embodiments, standing water can be simulated in relation to the structure 118 and/or the associated piece of real estate to determine a potential for water damage to the structure 118. In an example, accumulation of the simulated rain can cause standing water to form next to the structure 118 and/or on the associated piece of real estate. Alternatively, and/or in addition, the standing water can be a body of water, such as a lake and/or pond, in an example.

The standing water can be represented by a cross-hatch pattern and/or another type of pattern. In an example, the pattern can be formed from a color that is the same as the color that is used to represent the path of the individual rain drop. This can be beneficial in making it more apparent to a user that the pattern represents standing water because the color representing standing water is the same as the color representing the path of the individual rain drop.

In some embodiments, a rate at which the standing water will rise can be modeled. For instance, the rate at which the standing water will rise can be calculated based on a combination of water run off of surrounding real estate and/or a rate at which rainfall is occurring. In an example, a time associated with when the structure will flood can be calculated based on the determined rate at which the standing water will rise. For instance, an elevation existing between the standing water and a level at which the standing water will breach a barrier containing the standing water and/or will reach a height at which water damage will be caused to the structure can be used in the determination.

In an example, when rain and/or water contacts the ground and/or an object proximate to the structure, water can splash in an upward direction. In an example, as a result of the water splashing in the upward direction, the water can contact areas of the structure that falling rain may not contact. For instance, water splashing in the upward direction can contact an area behind siding and/or can enter vents associated with the structure. As such, water damage can be caused by the water splashing in the upward direction.

Accordingly, some embodiments can include modeling water that splashes in the upward direction. In an example, the path of the splashing water can be modeled in a same manner that the path of the individual rain drop is modeled. For instance, each drop of splashing water can have a have an associated path that is modeled. As such, a determination can be made whether the splashing water can cause water damage based on the path of the splashing water.

In some embodiments, a real-time view of the structure 118 can be generated through an interface of the mobile computing device. For instance, a user can hold the mobile computing device so that a field of view of a view finder on the mobile computing device includes the structure 118. An image of the structure 118 can then be displayed on the interface in real time. In an example, the simulated rain, wind, and/or standing water can be displayed in relation to the real-time view of the structure 118 through the interface of the mobile device.

In an example, the user can walk around the structure 118 with the mobile computing device and can view a real-time image of the structure 118 from various points of view surrounding the structure 118. In an example, the real-time image of the structure 118 can include the simulated rain, wind, and/or standing water. The user can then zoom in or out on particular areas of the structure 118 via functionality included on the user interface.

In an example, potential for water damage to the structure 118 can be determined based on the path of individual rain drops and/or can be determined based on the standing water and potential points of water entry. Potential points of water entry can be defined as points located on the structure 118 that can be susceptible to water entering the interior of the structure 118. The potential points of water entry can be, for example, vents placed on the side of the structure 118, roof of the structure 118, and/or under the eaves of the structure 118, although examples are not so limited. For instance, the vents can be a drier vent, attic vent, chimney vent, soffit vent.

In an example, when rain falls at a near vertical angle to the structure 118, the design of a vent may prevent the rain from entering the interior of the structure 118. However, when rain is blown at an angle that is near horizontal to the structure 118 and/or is blown upward due to wind, the design of the vent may not be effective in preventing the rain from entering the interior of the structure 118. As such, water can enter the interior of the structure 118 through the vent and cause potential water damage to the interior of the structure 118.

Alternatively, and/or in addition, potential points of water entry can include, for example, siding associated with the structure 118. For example, lap siding and/or shake siding can prevent rain that falls at a near vertical angle to the structure 118 from entering gaps between individual pieces of siding as a result of the individual pieces of siding overlapping one another. However, when rain is blown at an angle that is near horizontal to the structure 118 and/or is blown upward due to wind, the design of the lap siding and/or shake siding may not be effective in preventing the rain from entering gaps between the pieces of siding on the structure 118. As such, water can enter the interior of the structure 118 through the gaps in the siding and cause potential water damage to the interior of the structure 118.

Alternatively, and/or in addition, potential points of water entry can include points of the structure 118 that are at and/or below a ground level. For example, a door that is at ground level, a casement window that is below ground level, and/or points of a foundation of the structure 118 that are at ground level can be potential points of water entry. Such points may be susceptible to rain that is blown at an angle that is near horizontal to the structure 118 and/or may be susceptible to standing water that exists around the structure 118. For example, standing water can enter through a door that is at ground level, a casement window that is below ground level, and/or can seep through a foundation of the structure 118 thus causing potential water damage to the structure 118.

In an example, the potential points of water entry can be identified from the image captured by the camera. For instance, a recognition program can be used to identify the potential points of water entry based on a shape of the potential points of water entry, for example. Alternatively, and/or in addition, a user can enter information associated with the potential points of water entry. For example, a type of vent can be entered into the mobile computing device 102, a type of siding can be entered into the mobile computing device, etc. Alternatively, a database that includes potential points of water entry can be accessed by a user and icons representing potential points of water entry can be selected from the database and placed on the model of the structure 118.

For instance, the database can include potential points of water entry such as vents, doors, siding, etc. As such, the user can select a type of siding to apply to the model of the structure 118, a type of vent and/or a location of the vent on the side of the structure 118, and/or a type of door and/or location to place the door on the side of the structure 118. In an example, a drag and drop method can be used to place the potential points of water entry on the structure 118.

For instance, the user can select the potential point of water entry and drag it to a location where they wish to place the potential point of water entry. Based on the details associated with the potential points of water entry, for example, angle of louvers associated with a vent, amount of overlap associated with siding, whether gaps in the siding have been caulked with a filler, whether doors incorporate a waterproof seal, etc., a determination can be made whether a potential for water damage to the structure 118 exists at any one of the potential points of water entry upon running the simulation of rain and wind in relation to the structure 118.

In some embodiments, a determination of a potential for water damage within an interior of the structure 118 can be made based on the blueprint associated with the structure 118. In an example, a position of a wall, appliances, position of wiring, etc. can be correlated with potential points of water entry. For instance, if a potential for water damage to the structure 118 exists at any one of the potential points of water entry, a position of the point can be determined in relation to a position of features extracted from the blueprint of the interior of the structure 118.

As such, an indication can be provided to the user that the potential for water damage to the structure 118 exists and can also indicate an amount of damage that may be caused by the water damage. For instance, an amount of damage caused by water entering the structure 118 may be less if the water enters the structure 118 in a portion of the structure 118 that does not have finished walls, wiring, or appliances in that portion of the structure 118.

In some embodiments, the determination of potential water damage can be performed when architectural plans (e.g., blue prints) associated with the structure are being drafted. In an example, the structure 118 can be modeled from the architectural plans and the simulation can be run on the model. If the potential for water damage to the structure 118 exists, the architectural plans associated with the home can be modified, in an example. As such, this can result in cost savings, because the modifications may not need to be made to the structure 118 after construction is completed.

In some embodiments, a determination of whether to purchase flood insurance or to perform mitigation work to limit water damage to the structure 118 based on the determined potential for water damage can be made. In an example, a determination of a cost to perform mitigation work can be made by the mobile computing device 102. For instance, a cost associated with replacing a vent with a different type of vent may be determined. Alternatively, and/or in addition, a cost associated with replacing the siding of the structure 118 can be made. Alternatively, and/or in addition, a cost associated with performing landscaping to the property associated with the structure 118 can be made.

In some embodiments, suggestions for performing mitigation work to limit water damage to the structure 118 can be provided. For example, if a vent, siding, door, and/or landscaping is identified as a factor for potential water damage, a suggestion can be provided that the particular feature should be modified and/or replaced.

Alternatively, and/or in addition, a cost associated with purchasing flood insurance can be determined. The cost associated with purchasing flood insurance can be determined based on the number and/or type of potential points of water entry associated with the structure 118. In an example, the cost associated with purchasing flood insurance can be determined based on landscaping associated with the structure 118. For instance, landscaping associated with the structure 118 may cause a potential for standing water to abut a portion of the structure 118. As such, a greater potential for water damage to the structure 118 can exist.

In an example, the determination of whether to purchase flood insurance or perform mitigation work can be based on a cost associated with purchasing the flood insurance or performing the mitigation work. For instance, if a cost of purchasing the flood insurance is greater than performing the mitigation work, a determination can be made to perform the mitigation work. Alternatively, and/or in addition, if a cost of performing the mitigation work is greater than purchasing the flood insurance, a determination can be made to purchase the flood insurance.

Alternatively, and/or in addition, a determination can be made to perform a portion of the mitigation work and purchase the flood insurance. In an example, some of the mitigation work that is less costly and/or time consuming to perform can be completed. For instance, a determination may be made to replace siding on a structure, replace a door at ground level, and/or replace a number of vents on the structure. As such, less costly items such as replacing the door at ground level and/or replacing the number of vents on the structure can be performed. In addition, flood insurance can be purchased. In an example, a discount can be applied to the purchase of the flood insurance because the owner of the structure performed some of the mitigation work, which reduced the risk for potential water damage, thus reducing a potential insurance premium.

In some embodiments, a determination of whether the structure 118 has settled can be made based on a first survey performed at a first time and a second survey performed at a later time. For instance, a model of the structure 118 can be generated from the first survey performed at the first time.

In an example, a model of an associated piece of real estate can be generated from the first survey. As such, a first relationship between features of the structure 118 and the associated piece of real estate can be determined. For example, a height between a roof line of the structure 118 and where a base of the structure 118 meets the associated piece of real estate can be determined. Alternatively, and/or in addition, a height between a window, deck, and/or door and where the base of the structure 118 meets the associated piece of real estate can be determined.

In an example, a model of the structure 118 and a model of the associated real estate can be generated from the second survey performed at the later time. As such, the same features used to create the first relationship can be used to create a second relationship between the features of the structure 118 and the associated piece of real estate. The first relationship and the second relationship can then be compared to determine if settling of the structure 118 has occurred.

For instance, a distance between a roof line of the structure 118 and where a base of the structure 118 meets the associated piece of real estate that has been determined at the first time can be compared to a distance between a roof line of the structure 118 and where a base of the structure 118 meets the associated piece of real estate that has been determined at the second time. If a difference between the distances exists, a determination can be made that settling of the structure 118 has occurred.

In an example, the potential for water damage to the structure 118 can be determined based on a determination that the structure 118 has settled. In an example, if the entire structure 118 has settled, and/or a portion of the structure 118 has settled, the structure 118 may become susceptible to potential water damage caused by standing water abutting a base of the structure 118.

For example, if a portion of the structure 118 that includes a door settles to a position that is below ground level, standing water can abut the door and potentially leak through a seal around the door causing potential water damage to an interior of the structure 118. Alternatively, and/or in addition, cracks may form in a foundation of the structure 118 as a result of settling, causing a potential for water to enter the cracks.

In some embodiments, potential points for water entry can be highlighted on the model of the structure 118. For example, as a user is viewing the simulation of rain, wind, and/or standing water on the model of the structure 118 and/or the real-time view of the structure 118, potential points for water entry on the structure 118 can be highlighted with a particular color. This can provide an indication to the user that these particular points should be looked at in further detail. In an example, the user can click on each highlighted point and an explanation of why the point was highlighted and/or why the point may be a potential point for water entry can be provided to the user. Alternatively, and/or in addition, an explanation of a type of mitigation work that can be performed to the potential point for water entry and/or a cost of the mitigation work can be provided.

In some embodiments, the model of the structure 118 and/or the associated piece of real estate can be communicated to an external analysis entity 120. In an example, simulations of rain, wind, and/or standing water can be completed at the external analysis entity 120. For instance, the external analysis entity can include a computing device that possesses a greater amount of processing power and/or memory for simulating rain and/or wind in relation to the structure 118 and/or the associated piece of real estate to determine the potential for water damage to the structure 118.

Alternatively, and/or in addition, the external analysis entity 120 can determine whether to purchase flood insurance or perform mitigation work to limit water damage to the structure 118 based on the determined potential for water damage. Alternatively, and/or in addition, the external analysis entity 120 can perform other functions that the mobile computing device 102 can perform, as discussed herein.

Figure 2:
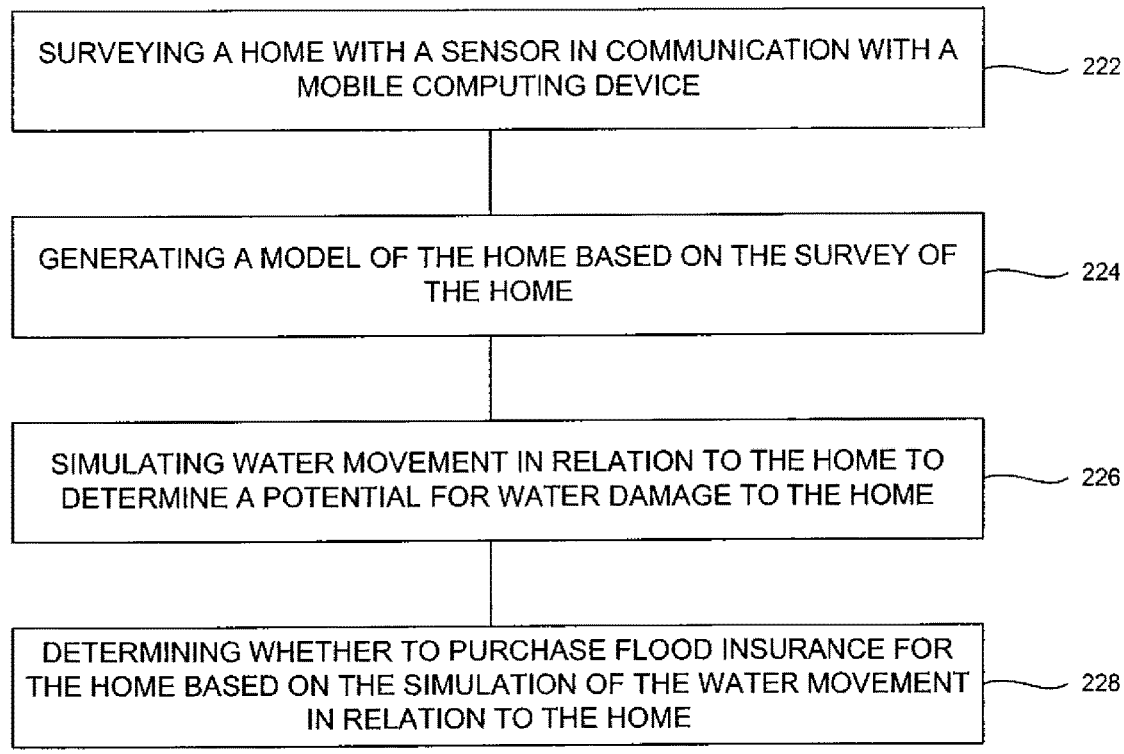
FIG. 2 illustrates a block diagram illustrating an example of a method for assessing potential water damage according to one or more embodiments of the present disclosure.

FIG. 2 illustrates a block diagram illustrating an example of a method for assessing potential water damage according to one or more embodiments of the present disclosure. In some embodiments, the method can include, at block 222, surveying a structure with a sensor in communication with a computing device. In an example, the computing device can be a mobile computing device. In an example, the survey can include a survey of the physical structure of the structure, a blue print of the structure, and/or a surrounding area of the structure.

For instance, the survey of the physical structure can include a survey of an exterior of the structure; the survey of the blue print of the structure can include a survey of a design drawing of the interior of the structure; and/or the survey of the surrounding area of the structure can include a survey of an associated piece of real estate of the structure. In an example the survey of the associated piece of real estate of the structure can include a survey of landscaping associated with the structure, as discussed herein.

In some embodiments, the sensor can include a camera. In an example, the survey can include capturing an image of the structure with the camera. For example, multiple images of the structure can be captured at different positions surrounding the structure.

In some embodiments, the method can include generating a model of the structure based on the survey of the structure, at block 224. In an example, the images of the structure captured at the different positions surrounding the structure can be assembled into a graphical model of the structure. In an example, as discussed herein, the model of the structure can be a 3-dimensional model of the structure. The model of the structure can then be displayed on a user interface of the computing device. In an example, the model can include a model of the structure, a model of the interior of the structure, and/or a model of a surrounding area of the structure.

In an example, the model of the structure can include layers. For instance, a first layer of the model can include an exterior of the structure that displays exterior features of the structure such as siding, windows, roofing, a deck, doors, etc. A second layer of the model can include an interior of the structure that displays a position of a wall, a width of the wall, a position and/or type of appliances, a position and/or type of wiring (e.g., circuit breaker, outlet, light fixture), a position of stairs, etc. In an example, upon display of the model on the user interface, a user can select different layers of the structure to view. For example, the first layer (e.g., exterior layer) of the structure may be displayed by default. However, upon selection by a user, the second layer (e.g., interior layer) of the structure may be displayed. This can allow a user to view particular features of the exterior layer of the structure and/or particular features of the interior layer of the structure.

In some embodiments, the method can include simulating water movement in relation to the structure to determine a potential for water damage to the structure, at block 226. In an example, simulating water movement in relation to the structure can include simulating rain fall in relation to the structure, simulating standing water in relation to the structure, and/or simulating moving water in relation to the structure. For example, simulating moving water in relation to the structure can include simulating runoff of rain water from the structure, a surrounding structure, and/or a surrounding piece of real estate.

Alternatively, and/or in addition, simulating moving water in relation to the structure can include simulating runoff of water and/or accumulation of water as a result of landscaping and/or construction associated with the home. For instance, runoff of water and/or accumulation of water can result from a change in grade made to a piece of real estate associated with the structure and/or can result from construction performed in relation to the structure. For instance, a knee wall can be built proximate to the structure, which can result in a diversion of water toward the structure, and/or an accumulation of water next to the structure.

In an example, changes can be made to the landscaping and/or construction via the model of the structure, the surrounding real estate, and/or a surrounding structure. As such, the changes to the landscaping and/or construction and the model can be re-run to determine what effect the changes to the landscaping and/or construction have had on the flow of water in relation to the structure. In an example, the changes can be made in the model without having to physically make the changes to the structure, surrounding real estate, and/or surrounding structure. As a result, the proposed changes can be modeled to determine whether the changes will result in remediation of the possibility for water damage to the structure without spending time and/or money to physically make the changes to the structure.

In some embodiments, the method can include simulating air movement in relation to the structure to determine a potential for water damage to the structure. In an example, as discussed herein, air movement can cause rain that is falling to travel at an angle that is near horizontal to the structure and/or vertically in relation to the structure. As a result, rain can enter potential points for water entry such as gaps between pieces of siding, vents, doors, etc., which can cause the potential for water damage. In an example, a speed of the air movement and/or an amount of rain fall can be varied to determine whether a potential for water damage to the structure exists.

In an example, a potential for water damage to the structure can be determined in a manner analogous to that discussed in relation to FIG. 1. For example, based on the details associated with potential points of water entry such as an angle of louvers associated with a vent, amount of overlap associated with siding, whether gaps in the siding have been caulked with a filler, whether doors incorporate a waterproof seal, etc., a determination can be made whether a potential for water damage to the structure exists at any one of the potential points of water entry upon running the simulation of rain and wind in relation to the structure.

In some embodiments, the method can include determining whether to purchase insurance for the structure based on the simulation of the water movement in relation to the structure, at block 228. In an example, the determination can include a determination of whether to purchase flood insurance for the structure based on the simulation of the water movement in relation to the structure. In an example, if a potential for water damage to the structure is determined to exist, a recommendation can be provided to an owner of a structure to purchase insurance.

In some embodiments, the method can include providing a recommendation for limiting water damage to the structure based on the determined potential for water damage. In an example, the recommendation for limiting water damage can include a recommendation to perform mitigation work to limit water damage to the structure based on the determined potential for water damage, as discussed herein. Alternatively, and/or in addition, the recommendation for limiting water damage can include a recommendation to contact a specialist for further assessment. For example, a recommendation can be provided to contact a specialist associated with the determined potential for water damage. In an example, contact information associated with the specialist can be provided via the computing device.

For instance, if the determined potential for water damage is determined to be associated with siding of the structure, a recommendation can be made to contact a siding specialist. Alternatively, and/or in addition, if the determined potential for water damage is determined to be associated with landscaping of the structure, a recommendation can be made to contact a landscaping specialist and/or drainage specialist. Alternatively, and/or in addition, if the determined potential for water damage is determined to be associated with a door, window, and/or vent of the structure, a recommendation can be made to contact a general contractor specialist, for example.

Alternatively, and/or in addition, some embodiments can include providing a recommendation with the computing device for a repair company that is a preferred repair company. In an example, a company can be preferred by a provider of the application that is downloaded on the computing device. In an instance, an insurance company can provide the application that is downloaded on the computing device. As such, the insurance company may have preferred repair companies because of prior transactions performed with the preferred repair companies.

Alternatively, and/or in addition, some embodiments can include providing a recommendation with the computing device to use a repair company that possesses the experience and/or materials for performing the mitigation work. For example, the computing device can determine what materials are needed to perform the mitigation work and check inventory records of repair companies and provide a recommendation to use a particular repair company that has the requisite materials in their inventory.

In an example, a recommendation to contact the specialist can be made if the computing device is unable to determine a recommendation for limiting water damage. Alternatively, and/or in addition, a recommendation to contact the specialist can be made even if the computing device is able to determine a recommendation for limiting water damage.

In some embodiments, the method can include updating the model of the structure to include the recommendation. In an example, the model of the structure can be updated to include mitigation work that has been recommended and/or mitigation work that has been performed. For instance, the model of the structure can be updated with mitigation work that has been recommended by the computing device and/or by a specialist.

For example, the mitigation work does not need to be completed in order for the model of the structure to be updated with the mitigation work. In an example, if the mitigation work includes replacing a vent, the model of the structure can be updated with the replacement vent. For instance, the replacement vent can be selected from a database that includes potential points of water entry and can be placed on the model of the structure, as discussed herein.

In some embodiments, the method can include simulating at least one of water movement and/or wind movement in relation to the updated model of the structure. In an example, the simulation can be run to determine how the mitigation work has affected the potential for water damage to the structure. In an example, the model of the structure can be updated with different types of mitigation work to determine which type of mitigation work will limit the potential for water damage. As such, an effectiveness of different types of mitigation work can be modeled without having to physically complete the mitigation work, thus saving time and/or expenses.

In some embodiments, the method can include determining an amount that insurance will cost, based on the potential for water damage to the structure. In an example, the potential for water damage to the structure can be factored into a quote for insurance. The quote for insurance can be determined by the computing device, for example. Alternatively, and/or in addition, the quote for insurance can be determined by an external analysis entity.

In an example, the model of the structure can be sent to the external analysis entity by the computing device and an analysis of the model of the structure can be performed by a computing device and/or individual to determine a quote for insurance. The quote for insurance can then be sent back to the computing device for review by a user of the computing device.

In an example, the quote can include recommended mitigation work that has been recommended by the computing device and/or a specialist, for example. As such, the quote for insurance can be for a discounted rate that is contingent on the mitigation work being performed.

In an example, the method can include determining an amount that completing the recommendation for limiting water damage will cost. In an example, the computing device can determine a cost associated with materials and/or a cost associated with labor for completing the recommendation for limiting water damage. In an example, the computing device can access a database that includes costs for particular mitigation work and/or can perform an internet search to determine costs for particular mitigation work.

For instance, the computing device can determine a square footage and/or type of siding, a size and/or type of door, a size and/or type of vent, a type and/or amount of landscaping, etc., and/or determine an associated cost associated with the square footage and/or type of siding, a size and/or type of door, a size and/or type of vent, a type and/or amount of landscaping, etc. Alternatively, and/or in addition, the computing device can determine a cost associated with installation and/or completion of the mitigation work being completed with respect to siding, a door, a vent, landscaping, etc.

In some embodiments, the model of the structure and/or a determined potential for water damage can be stored in a database. For instance, a homefax database may store details regarding the structure that have been generated from the model of the home and/or the determined potential for water damage. Alternatively, and/or in addition, the database may include details associated with a functional life of building materials used to construct the structure. For instance, roofing material and/or siding material may be expected to last an additional 7 years based on a generated model.

As such, the expected life of the roofing material and/or siding material can be stored in the database. Alternatively, and/or in addition, insurance claims associated with the structure, repairs, and/or construction associated with the structure can be stored in the database. For instance, the database can include details associated with the physical structure, surrounding landscaping, and/or property grounds. In an example, a potential buyer of the structure could access the database to view the history of the house and determine if there are any potential problems with the house, prior to buying the house. Alternatively, and/or in addition, the details stored in the database could be used when negotiating a purchase price for the house, in an example. For instance, a buyer and/or seller can point to positive aspects and/or negative aspects disclosed in a homefax report produced from the database that includes details associated with the physical structure, surrounding landscaping, and/or property grounds. For instance, a contractor that performed changes associated with the physical structure, surrounding landscaping, and/or property grounds can be included; a reason for the changes can be included; and/or details associated with the changes can be included (e.g., types of materials used).

Alternatively, and/or in addition, the homefax database can include details associated with the physical structure, surrounding landscaping, property grounds, and/or changes made to the physical structure, surrounding landscaping, and/or property grounds. In an example, the homefax database can include details associated with a pool that has been added, an addition made to the physical structure, and/or changes made to the landscaping. Alternatively, and/or in addition, the homefax database can include building codes associated with the physical structure, surrounding landscaping, and/or property grounds. In an example, the homefax website can show only those building codes which are applicable to changes made to the physical structure, surrounding landscaping, and/or property grounds. As such, a user of the database may not be overwhelmed by every existing building code.

In some embodiments, the method can include determining whether to purchase the insurance and/or to complete the recommendation for limiting water damage based on the cost of insurance and/or the cost of completing the recommendation. In an example, a comparison between the cost of purchasing insurance and the cost of completing the recommendation can be made. In an example, the cost of purchasing the insurance can be calculated according to a defined number of years and/or months.

For instance, the cost of purchasing the insurance can be calculated as a total cost over 10 years and/or a total cost per month. Alternatively, and/or in addition, if mitigation work is completed, the cost of the work can be calculated according to a defined number of years and/or months. For instance, if the mitigation work has a lifespan of a certain number of years before the work will have to be completed again, a cost per month and/or cost per year for the mitigation work can be determined.

For instance, if the mitigation work includes replacing siding associated with the structure, a lifespan of the siding and an associated cost per period of time (e.g., month) can be determined. In an example, a cost of the siding per month can be determined to be $110.00 per month and a cost of insurance can be $40.00 per month. As such, based upon a comparison between the cost of purchasing insurance and the cost of replacing the siding of the structure, a determination can be made to purchase insurance as a result of the lesser cost.

Figure 3:
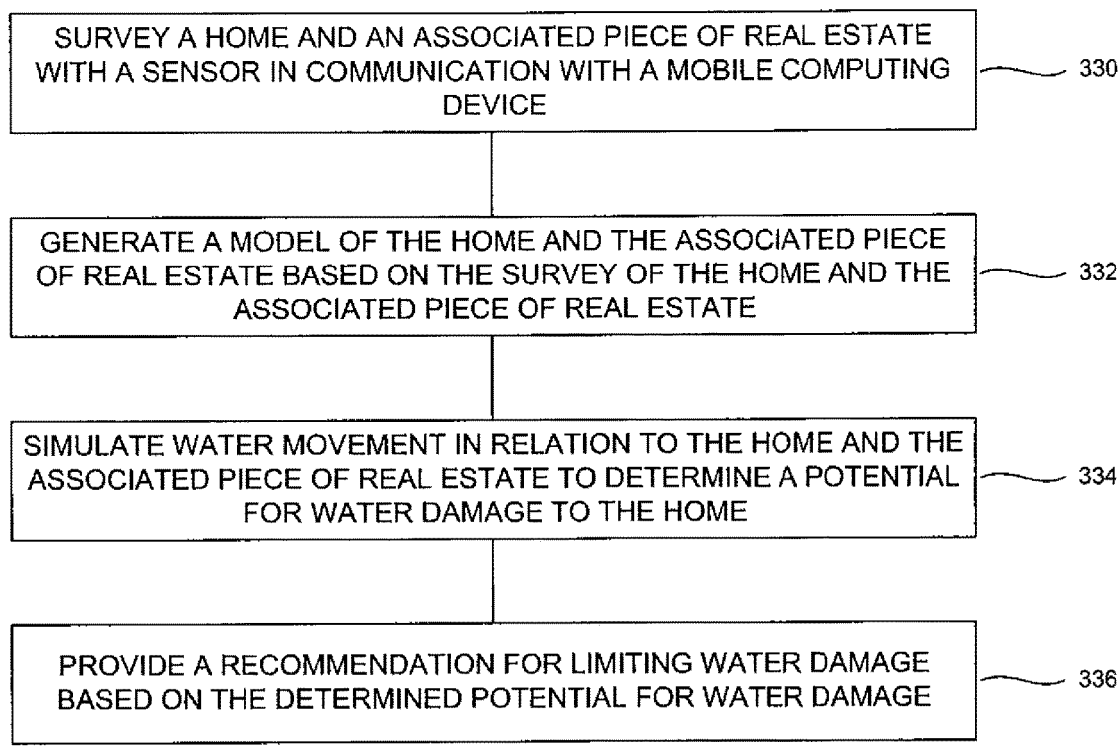
FIG. 3 illustrates a block diagram illustrating an example of a set of instructions to assess potential water damage according to one or more embodiments of the present disclosure.

FIG. 3 illustrates a block diagram illustrating an example of a set of instructions to assess potential water damage according to one or more embodiments of the present disclosure. At block 330, the instructions can be executed to survey a structure and/or an associated piece of real estate with a sensor in communication with a mobile computing device. In an example, the sensor can be a global positioning system and the survey can include determining an elevation of the associated piece of real estate with the global positioning system, as discussed herein. Alternatively, and/or in addition, the sensor can be a camera and the survey can include capturing an image of the structure and/or the associated piece of real estate with the camera.

In some embodiments, a model of the structure and the associated piece of real estate can be generated based on the survey of the structure and/or the associated piece of real estate, at block 332. For instance, an elevation of the associated piece of real estate can be determined by the mobile computing device through data gathered via the global positioning system. In an example, a user can walk around the piece of real estate with the mobile computing device and collect elevation data through the global positioning system.

In some embodiments, at block 334, water movement can be simulated in relation to the structure and/or the associated piece of real estate to determine a potential for water damage to the structure. In an example, rain, wind, and/or standing water can be simulated in relation to the structure. In an example, a model of an adjacent structure and a piece of real estate associated with the adjacent structure can be generated and water movement in relation to the adjacent structure and the piece of real estate associated with the adjacent structure can be simulated to determine a potential for water damage to the structure. In an example, rain, wind, and/or standing water can be simulated in relation to the adjacent structure and the piece of real estate associated with the adjacent structure. Alternatively, rain, wind, and/or standing water can be simulated in relation to an adjacent piece of real estate.

In an example, the adjacent structure and/or the piece of real estate associated with the adjacent structure can affect water movement in relation to the structure. In an example, landscaping of the real estate associated with the adjacent structure can direct water flow toward the structure. For instance, if the real estate associated with the adjacent structure is sloped toward the structure, water can drain toward the structure and cause an accumulation of standing water. Alternatively, and/or in addition, the adjacent structure can affect water movement in relation to the structure. For instance, wind can blow water off of a roof of the adjacent structure and/or the adjacent structure can have gutters with a down spout that drains toward the structure, causing an accumulation of standing water. Alternatively, and/or in addition, the adjacent structure may not have gutters, causing an accumulation of standing water and/or can result in water being blown off of the roof and causing a potential for water damage to the structure.

Alternatively, and/or in addition, the adjacent structure and/or the real estate associated with the adjacent structure can affect wind movement in relation to the structure. For example, a speed and/or direction of wind can be changed as a result of the adjacent structure and/or the real estate associated with the adjacent structure. As such, the wind can cause an angle at which the rain falls to change, for example, causing a potential for water damage to the structure. For instance, a velocity of wind may be increased between the structure and the adjacent structure, changing an angle at which the rain falls.

In some embodiments, the mobile computing device can provide a quote for flood insurance, as discussed herein. In an example the quote can be provided by the mobile computing device and/or the quote can be provided by an external analysis entity, as discussed herein. In an example, the user can make a selection on the mobile computing device to purchase the flood insurance.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A machine-readable non-transitory medium storing instructions for assessing potential water damage, the instructions executable by a machine to cause the machine to:
    survey, using a sensor, a property that includes a structure;
    generate, based on surveying the property, a multi-dimensional model of the property, the multi-dimensional model modeling movement of water on the property;
    simulate, using the multi-dimensional model, the movement of water on the property over a period of time to determine an impact to the property from the movement of water, wherein the impact to the property includes a pattern of wear for at least one material used in a construction of the structure;
    determine a risk of water damage to the property over the period of time based on the determined impact to the property from the movement of water;
    provide, on an interface, a recommendation for limiting water damage to the property based on the determined risk of water damage;
    generate a real-time view of the structure based on the multi-dimensional model; and
    display, on the interface and using the multi-dimensional model, a simulation of forecasted weather in relation to the real-time view of the structure through the interface.

2. The medium of claim 1, further comprising instructions to:
    survey, using the sensor, an adjacent property that includes an adjacent structure, wherein the multi-dimensional model of the property is generated based on surveying the adjacent property, and wherein impact to the property is further determined based on simulating the movement of water on the adjacent property.

3. The medium of claim 1, further comprising instructions to:
    determine a quote for flood insurance based on the determined risk of water damage to the property;
    provide, on the interface, the quote for flood insurance.

4. The medium of claim 1, further comprising instructions to:
    generate, based on surveying the property, an elevation of the property, wherein the sensor comprises a global positioning system receiver, and wherein the multi-dimensional model of the property is generated based on the elevation.

5. The medium of claim 1, wherein the sensor comprises a camera, and wherein surveying the property includes capturing an image of the structure with the camera.

6. A system for assessing potential water damage, the system comprising a processing resource in communication with a non-transitory computer-readable medium, wherein the non-transitory computer-readable medium contains a set of instructions and wherein the processing resource is designed to execute the set of instructions to:
    survey a property that includes a structure, wherein surveying the property includes capturing an image of the structure with a sensor and receiving a blueprint associated with the structure;
    generate, based on the image and the blueprint, a multi-dimensional model of the property modeling movement of water on the property;
    simulate, using the multi-dimensional model, the movement of water on the property over a period of time to determine an impact to the property from the movement of water, wherein the impact to the property includes a pattern of wear for at least one material used in a construction of the structure;
    determine a risk of water damage to the property over the period of time based on the determined impact to the property from the movement of water;
    determine an offer for flood insurance for a user associated with the property or actions to mitigate the risk of water damage to the property determined based on the risk of water damage to the property and the simulated movement of water;
    display, on an interface, the offer for flood insurance or the actions to mitigate the risk of water damage to the property;
    generate a real-time view of the structure based on the multi-dimensional model; and
    display, on the interface and using the multi-dimensional model, a simulation of forecasted weather in relation to the real-time view of the structure through the interface.

7. The system of claim 6, wherein the multi-dimensional model varies an amount of rain and a speed of the wind to simulate the movement of water on the property.

8. The system of claim 6, wherein the risk of water damage to the property includes a risk of water damage to an interior of the structure.

9. The system of claim 6, wherein the instructions are executed to:
    determine that the structure has settled based on surveying the property and a previous survey of the property performed at an earlier time; and
    determine the risk of water damage to the structure based on determining that the structure has settled.

10. The medium of claim 1, wherein the impact to the property includes erosion on the property over the period of time.

11. The medium of claim 1, wherein the multi-dimensional model of the property simulates plant growth on the property over the period of time, and wherein impact to the property is determined according to the movement of water in relation to the simulated plant growth.

12. The system of claim 6, wherein the impact to the property includes erosion on the property over the period of time.

13. The system of claim 6, wherein the multi-dimensional model of the property simulates plant growth on the property over the period of time, and wherein impact to the property is determined according to the movement of water in relation to the simulated plant growth.

\* \* \* \* \*